(12) United States Patent
Engelke

(10) Patent No.: US 6,605,944 B2
(45) Date of Patent: Aug. 12, 2003

(54) NMR PROBEHEAD WITH A LINE RESONATOR CONFIGURED AS A DELAY LINE

(75) Inventor: Frank Engelke, Rheinstetten (DE)

(73) Assignee: Bruker Analytik GmbH, Silberstreifen (DE)

( * ) Notice: Subject to any disclaimer, the term of this patent is extended or adjusted under 35 U.S.C. 154(b) by 0 days.

(21) Appl. No.: 09/839,591

(22) Filed: Apr. 20, 2001

(65) Prior Publication Data
US 2002/0033696 A1 Mar. 21, 2002

(30) Foreign Application Priority Data
Apr. 22, 2000 (DE) .......................... 100 19 990

(51) Int. Cl.⁷ .................................. G01V 3/00
(52) U.S. Cl. ................... 324/318; 324/307; 324/322
(58) Field of Search ............................... 324/318, 322, 324/309, 307

(56) References Cited

U.S. PATENT DOCUMENTS

| 5,545,998 A | * | 8/1996 | Favre et al. ............... 324/321 |
| 5,557,247 A | * | 9/1996 | Vaughn, Jr. ............... 324/318 |
| 5,886,596 A | * | 3/1999 | Vaughan, Jr. .............. 324/318 |
| 6,204,665 B1 | * | 3/2001 | Triebe et al. .............. 324/318 |
| 6,278,277 B1 | * | 8/2001 | Zeiger ........................ 324/300 |
| 6,307,371 B1 | * | 10/2001 | Zeiger ........................ 324/318 |

FOREIGN PATENT DOCUMENTS

| WO | WO 87/06065 | 10/1987 |
| WO | WO 97/18482 | 5/1997 |

* cited by examiner

Primary Examiner—Edward Lefkowitz
Assistant Examiner—Dixomara Vargas

(57) ABSTRACT

A probehead for nuclear magnetic resonance measurements has a network. The network comprises in series an NMR coil for receiving a sample, a line resonator as well as a probehead terminal. The line resonator is configured as a delay line.

21 Claims, 2 Drawing Sheets

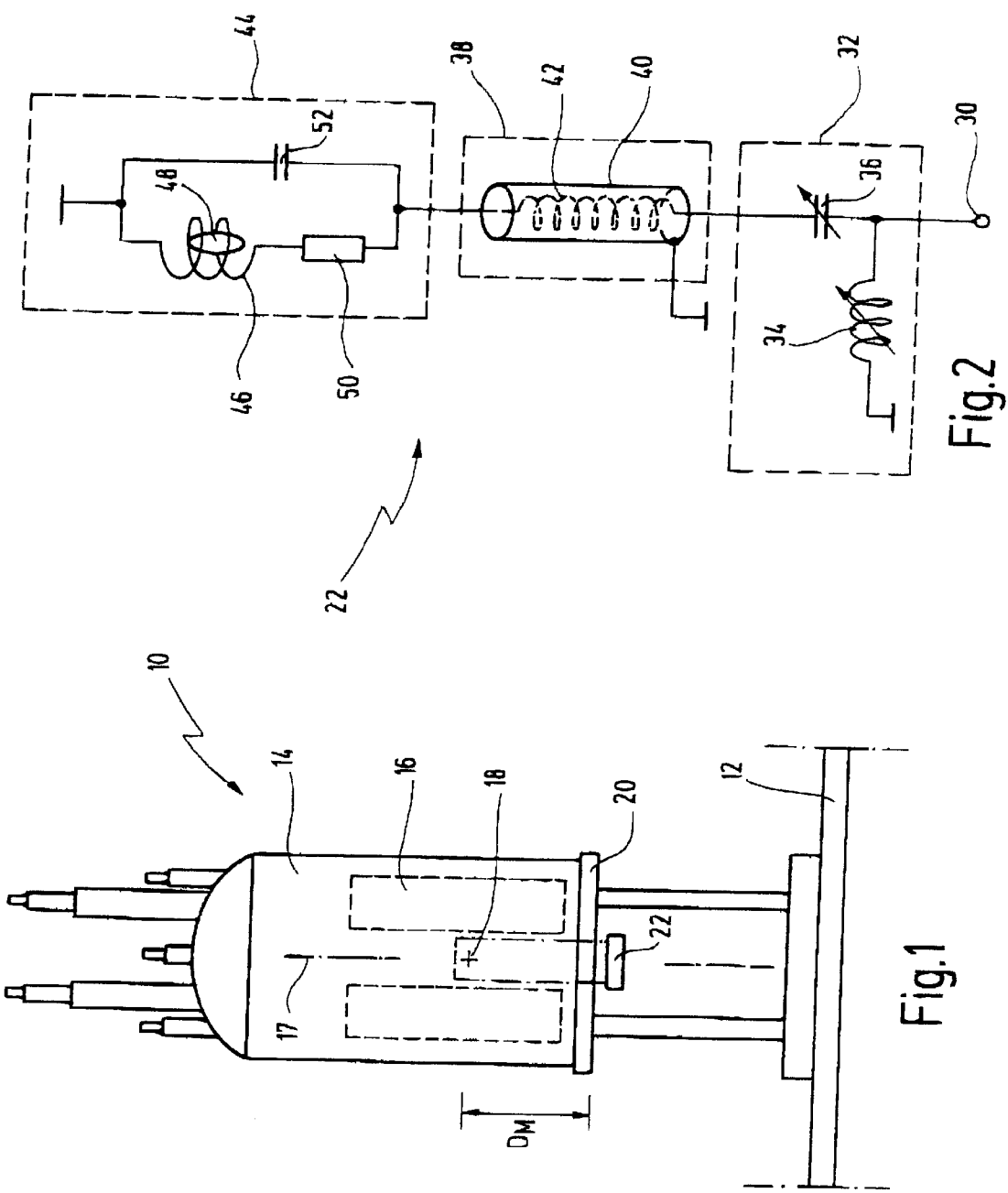

NMR PROBEHEAD WITH A LINE RESONATOR CONFIGURED AS A DELAY LINE

FIELD OF THE INVENTION

The present application is related to the field of magnetic resonance, in particular nuclear magnetic resonance (MMR).

More specifically, the invention is related to probeheads for NMR spectometers.

Still more specifically, the invention is related to a probehead for nuclear magnetic resonance measurements having a network comprising an NMR coil for receiving a sample, a line resonator as well as a probehead terminal.

BACKGROUND OF THE INVENTION

A probehead of the afore-mentioned type is disclosed in German patent specification DE 40 02 160 C2.

This prior art probehead is intended to be used for executing nuclear double resonance experiments. During such experiments a first kind of nuclei, commonly protons ($^1$H) or fluorine ($^{19}$F) is excited and/or observed, whereas as a second kind of nuclei e.g. an isotope of nitrogen ($^{15}$N) or of phosphor ($^{31}$P) or of carbon ($^{13}$C) is excited and/or observed. In up to date high field nuclear resonance spectrometers the exciting frequency for protons ($^1$H) may, for example, be set to be 400 MHz or even higher. The exciting frequency (always related to the same magnetic field strength) for the afore-mentioned isotopes of nitrogen ($^{15}$N) would be approximately 40.5 MHz, for phosphor ($^{31}$P) 162.0 MHz and for carbon ($^{13}$C) 100.5 MHz. The entire frequency range within which such resonance experiments are conducted, may, therefore, exceed a range of between 40 and 400 MHz and, in extreme cases for certain kinds of nuclei may even begin below 40 MHz and, at higher fields, may extend above 400 MHz.

Probeheads of the type of interest in the present context have a frequency-determining element for optimizing the frequency. This element optimizes the probehead network for the respective center frequency or, in the case of double resonance experiments, for the two measuring frequencies. Elements of the most different type have been utilized for that purpose, the specific type of the component used resulting from the specific operating frequency on the one hand side and, from the very limited space available in a probehead for nuclear resonance measurements, on the other hand side. Within a probehead the available space is limited because the probehead, when in operation, is located within a magnet system, i.e. within a superconducting magnet system at high measuring frequencies, having an accessible bore of very narrow dimensions due to the required very high homogeneity of the magnetic field.

In the prior art probehead disclosed in German patent specification DE 40 02 160 C2 a line resonator of conventional coaxial design is utilized as the frequency-determining element. On one half of its length the line resonator comprises a switch by means of which the electrical length of the line resonator may be divided in two if necessity arises.

In another similar probehead of the type of interest in the present context, as disclosed in German patent specification 198 33 350 C1 a line resonator is likewise used as the frequency-determining element. A series capacitor is provided between this line resonator and the measuring coil, and a switch is provided for bridging the series capacitor.

Both afore-mentioned prior art probeheads are used, as mentioned before, for executing nuclear resonance measurements with at least two different kinds of nuclei, i.e. so-called double resonance experiments. The measuring frequency for exciting the protons ($^1$H) may be fed to the NMR coil from the probehead terminal via the line capacitor, however, this is not absolutely necessary.

U.S. Pat. No. 5,861,748 discloses still another probehead for nuclear resonance measurements which is said to also allow measurements for a plurality of nuclear resonance measuring frequencies of various kinds of nuclei. This prior art probehead consists of a highly branched assembly of coaxial lines of various lengths and different tapping points with respective different matching elements for the various measuring frequencies. The coaxial line system of this prior art probehead is of particular disadvantage when during a change from one to another kind of nuclei one has to switch over to another piece of coaxial line for the respective lower operating frequency. Moreover, it cannot be seen how the disclosed coaxial line system shall be housed within an elongate probehead of small diameter, as is typically utilized for high field magnets.

Further probehends for nuclear resonance measurements are disclosed in U.S. Pat. No. 4,446,431 as well as in published European patent application 0 579 473. These prior art probeheads also utilize conventional coaxial lines as line resonators.

High frequency lines have inductances and capacitances distributed over the line length. A high frequency line of predetermined length may be used as an electromagnetic resonator (line resonator) allowing the generation of standing electromagnetic waves. The resonance frequency of a line resonator depends on the line length, the dielectric used in the line and on the complex impedances of the elements terminating the line at both its ends. A line resonator is characterized by its characteristic impedance, its loss resistance and its characteristic wavelength of the standing waves generated therein.

As already mentioned, line resonators have been used in NMR probeheads according to the prior art, wherein coaxial lines have been used in all such line resonators, i.e. lines having a straight cylindrical inner conductor within a cylindrical outer conductor. Electromagnetic waves may propagate or may be generated as standing waves on the line in such lines at all frequencies. The waves have only electrical and magnetic field components being directed perpendicular to the direction of propagation. Such waves are conventionally identified as transversal electromagnetic (TEM) modes. They have a characteristic wavelength $\lambda_0$, being equal to the wavelength of a planar wave propagating within a dielectric material of dielectric constant $\in_r$. Besides TEM-waves modes may appear, in particular at higher frequencies, having longitudinal components of the electric or the magnetic field strength.

In NMR probeheads lines having a straight inner conductor are, for example, configured as $\lambda_0/4$-resonators, i.e. a standing wave is generated on the line corresponding to a quarter of the wavelength. If the operating frequency of the probehead circuitry is set to a predetermined value, the required geometrical length of the line depends on the dielectric constant $\in_r$ of the dielectric repleting the space between the inner and the outer conductor, and of the complex impedances of the elements terminating both ends of the line. These terminating impedances may be short-circuit impedances as well as capacitors, discrete coils, other lines or circuits made from such elements. Within NMR probeheads lines having a straight inner conductor may e.g. also be configured as $\lambda_0/2$ resonators in which a standing half wave is generated on the line. The same principal relationships mentioned above with respect to the dielectric within the line and the complex terminating impedances apply for the geometrical length of such a $\lambda_0/2$ resonator. The configuration of the lines as $\lambda_0/4$ or $\lambda_0/2$ resonators shall only be understood as examples. Within high frequency circuits also other line lengths are used, depending on the particular requirement.

If, for example, a line is used being short-circuited at one terminal thereof and being open at its other terminal with air as a dielectric between the straight inner and outer conductors, an operating frequency of 300 MHz yields a line length of 25 cm for a $\lambda_0/4$ resonator because the free wave length for an operating frequency of 300 MHz is just 1 m. An equivalent line being, however, open at both terminal ends acts as a $\lambda_0/2$ resonator having a length of 50 cm at 300 MHz. If such lines are utilized in high frequency circuits within NMR probeheads, deviations of the line length to be selected occur depending on the complex terminating impedances because the latter are generally not a short circuit for the line terminal or are not equal to the terminating impedance of a line being open at its end. If, for example, a discrete capacitor is used as a terminating impedance at the end of a $\lambda_0/2$ line resonator, the required line length is shortened depending on the capacity of the capacitor.

With the examples mentioned above it becomes apparent that in particular at frequencies below 200 MHz the length of line resonators with straight inner conductor may become relatively long within NMR probeheads. At low NMR operating frequencies, therefore, the line length within the probehead may become greater than the distance between the magnetic center of a superconducting magnet and the end of the cryostat, i.e. the lower end of the magnet. If it is intended to limit the length of the NMR probehead to this distance, i.e. about one half of the cryostat length, it is impossible to use line resonators of arbitrary great lengths. This holds true in particular for the measurement of isotopes having a relatively low measuring frequency and, hence, a great wavelength. If, for example, the superconducting magnet is operated at a field strength of 11, 74 T, the NMR measuring frequency of the nitrogen isotope $^{15}$N is about 50 MHz. A $\lambda_0/2$ line resonator being open at both ends would then have a length of 300 cm being significantly longer than the half length of a conventional cryostat being of the order of about 50 cm. Even if the line resonator would be provided with a dielectric of a high relative dielectric constant $\in_r$ in the range of between 2 and 3, the line length would be shortened only proportional to the square root of the dielectric constant, i.e. within the range of between 1,4 and 1,7. Insofar, one has to take into account that providing a dielectric in a line resonator results in a drastic decrease of the high frequency breakthrough voltage which, in turn, has the effect that the probehead may only be operated at limited high frequency powers.

It is, therefore, an object underlying the present invention to provide a probehead of the type specified at the outset such that a construction of the smallest possible length is generated. In particular, it shall become possible to design the probehead so short that it may be entirely housed within a conventional cryostat of a superconducting magnet even at very low measuring frequencies.

SUMMARY OF THE INVENTION

In a probehead of the type specified at the outset, this object is achieved by the present invention in that the line resonator is configured as a delay line.

The object underlying the invention is thus entirely solved.

Namely, if the line resonator is configured as a delay line, a substantial geometrical shortening of the line length is achieved, according to the particular design used and, hence, a corresponding shortening of the probehead without incurring the disadvantages of an electrical shortening through a dielectric or the like.

Therefore, the inventive measures allow to design probeheads for nuclear resonance measurements being so short even for measurements on isotopes having an extremely low NMR frequency, such that the entire probehead may be housed on about half the length of a conventional cryostat of a high field superconducting magnet.

According to the invention it is preferred when the delay line has a closed outer conductor as well as an inner conductor, wherein the outer conductor is preferably essentially cylindrical.

According to the invention the inner conductor may be provided with a spatially periodical structure effecting a wavelength compression.

According to embodiments of the invention the inner conductor may be configured helically or essentially cylindrical and then slotted radially.

These embodiments of spatially periodic structures in the area of the inner conductor allow a compression of the characteristic of the line even if air is utilized as a dielectrics such that at NMR frequencies in the range of between 40 and 200 MHz the usable length within the NMR cryostat is not exceeded.

If the inner conductor is configured helically, it is further preferred that it surrounds a body.

This measure has the advantage that an additional shortening of the line may be achieved.

As an alternative, this holds true also when the body is a dielectric or an electrically conducting body, in which case the helical inner conductor is covered by an isolating coating.

In preferred embodiments of the invention the body may be as long as the helical inner conductor or may be shorter.

In further embodiments of the invention the body may be tightly surrounded by the helical inner conductor or may be surrounded at a distance.

It is particularly preferred when the helical inner conductor has between 100 and 600 windings per meter length of the delay line.

If the inner conductor in an alternate embodiment is essentially cylindrical and slotted radially, a comparable effect is achieved when the inner conductor has between 100 and 600 slots per meter length of the delay line.

When the afore-mentioned measures are taken, it is preferably possible to configurate the delay line such that at a given measuring frequency it has an effective wavelength being shorter by a factor of between 1,6 and 7 as compared to the free measuring frequency wavelength.

If the delay line has an essentially cylindrical outer conductor, then it is further preferred when it has a length being at least one order of magnitude greater than the diameter of the outer conductor.

Moreover, there are preferred embodiments of the invention in which for a further shortening of the probehead a gap is provided between the inner conductor and the outer conductor, and the gap is repleted with a dielectric, as known per se.

In those embodiments with helical inner conductor, in which the inner conductor already surrounds a dielectric body, the dielectric constant of the inner and of the outer dielectric may be selected differently.

Finally, embodiments of the invention are preferred in which the Inner conductor is provided with at least one tap.

Further advantages will become apparent from the description and the enclosed drawing.

It goes without saying that the aforementioned features and those that will be mentioned hereinafter may not only be used in the particularly given combination but also in other combinations or alone, without leaving the scope of the present invention.

BRIEF DESCRIPTION OF THE DRAWINGS

Embodiments of the invention are shown in the drawing and will be explained in further detail within the subsequent description.

FIG. 1 shows a schematic side elevational view of a superconducting magnet system as used for NMR measurements;

FIG. 2 shows an embodiment of a network of a probehead for nuclear resonance measurements as an electric block or equivalent circuit diagram;

DETAILED DESCRIPTION OF THE PREFERRED EMBODIMENTS

Figure 4:
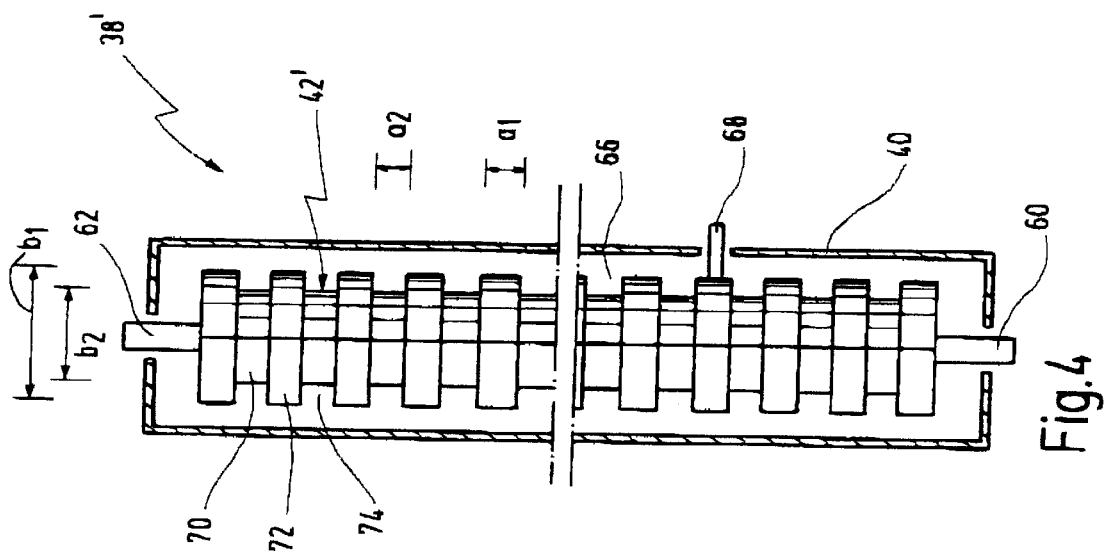
FIG. 4 shows a variation of the illustration of FIG. 3.

In FIG. 1 reference numeral 10 as a whole indicates an NMR cryo magnet, i.e. a superconducting magnet system of essentially conventional design.

Magnet 10 stands on a floor 12. It comprises a cryostat 14. A superconducting magnet coil 16 indicated in dashed lines which in the shown embodiment, is a solenoid coil, and is arranged within cryostat 14. The axis of coil 16 is identified at 17. In the embodiment shown, it extends in a vertical direction.

A magnetic center 18, i.e. the point of highest homogeneity of the magnetic field generated by coil 16 is located within the geometrical center of coil 16.

An NMR probehead 22 may be introduced into the bore of magnet 10 from a lower side 20 of cryostat 14, the bore being at room temperature. $D_M$ indicates the distance between lower side 20 and magnetic center 18. If it is intended to house probehead 22 entirely within length $D_M$, if possible, then probehead 22 may not comprise any elements being geometrically longer than $D_M$.

FIG. 2 shows an electric equivalent circuit diagram or block diagram, respectively, of probehead 22.

A terminal 30 is connected to a network 32. A variable inductance 34 is provided for matching probehead 22 to the conventional input impedance of 50 Ω at the input of probehead 22. A variable capacitance 36 is used for the fine tuning of the resonance frequency of probehead 22.

Network 32 is connected to a line resonator 38 consisting of a preferably cylindrical outer conductor 40 as well as an inner conductor 42. Outer conductor 40 is connected to ground.

As will be explained in further detail below in connection with FIGS. 3 and 4, inner conductor 42 has a spatially periodical structure and, hence, electrically acts as a delay line.

Line resonator 38, in turn, is connected to an NMR coil 44 which is also shown as an equivalent circuit diagram in FIG. 2. The equivalent circuit diagram comprises an inductivity 46 in which a sample 48 under investigation is positioned. The equivalent circuit of NMR coil 44, further, comprises a lossy resistor 50 as well as a winding capacity 52. At its terminal end opposite line resonator 38, NMR coil 44 is connected to ground.

Figure 3:
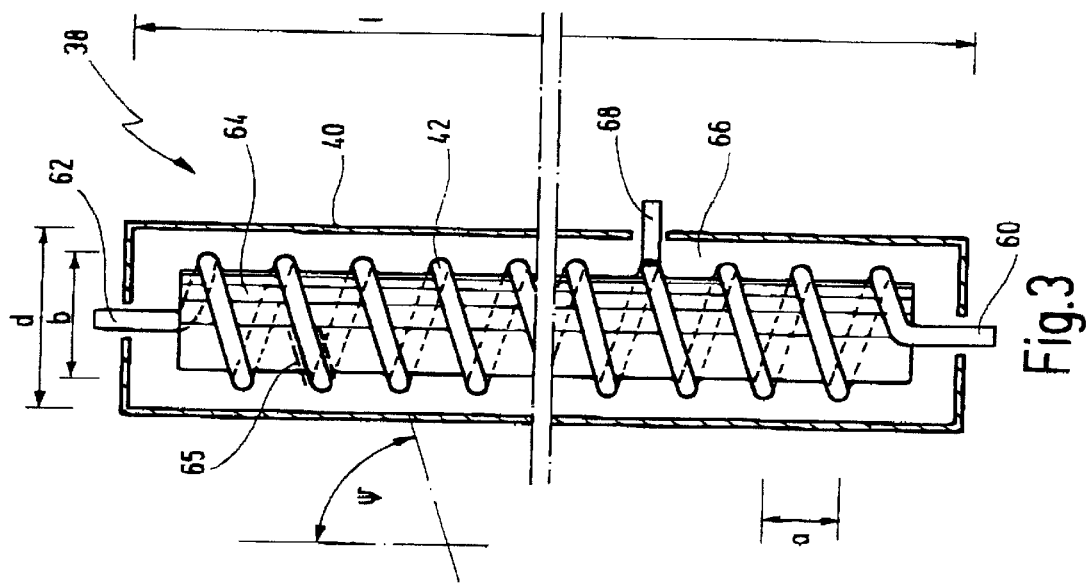
FIG. 3 shows a first embodiment of a line resonator configured as a delay line, adapted to be used in the probehead of FIG. 2.

FIG. 3 shows a first embodiment for line resonator 38.

Line resonator 38 comprises a helical inner conductor 42, the lower end 60 and the upper end 62 of which both extend outside of cylindrical outer conductor 40. Inner conductor 42 in preferred embodiments of the invention may surround a body 64. Body 64 may either be tightly surrounded by helical inner conductor 40 (as shown) or may be surrounded at a distance. It may, further, be configured shorter than or as long as helical inner conductor 42.

It is particularly preferred to make body 64 from a dielectric material.

In another embodiment of the invention, body 64 may also consist of an electrically conducting material. If helical inner conductor 40 in that situation tightly lies on body 64, it is necessary to provide inner conductor 42 with an isolating coating as indicated in FIG. 3 at 65.

In the shown embodiment, there is a gap 66 between inner conductor 42 and outer conductor 40. Gap 66 may be repleted with a dielectric. If body 64 also consists of a dielectric material, then the relative dielectric constance of body 64 on the one hand and of dielectric within gap 66 on the other hand may be selected at different values.

Reference numeral 68 indicates an intermediate tap extending from inner conductor 42 through an opening within outer conductor 40 and into the exterior.

In FIG. 3, the line length of line resonator 38 is given as 1. The diameter of outer conductor 40 is given to be d, the diameter of helical inner conductor 42 is identified as b. The threads of helical inner conductor 42 have an axial distance a. The inclination of the threads is identified with ψ.

In the alternate embodiment of FIG. 4, the relationships are similar as in the embodiment of FIG. 3 so that like reference numerals are used for like components.

In the embodiment of FIG. 4, inner conductor 42' consists of an inner rod 70 being periodically provided with circumferential shoulders 72 such that gaps 74 remain therebetween.

The axial width of circumferential shoulders 42 is indicated with $a_1$ and the width of gaps 74 is given as $a_2$. The outer diameter of inner rod 70 is given as $b_1$ and the inner diameter as $b_2$.

In the embodiment of FIG. 4, one may also provide an intermediate tap 68 or several such intermediate taps.

Considering now, for example, the embodiment of FIG. 3, i.e. a cylindrical outer conductor, a helical inner conductor as well as a dielectric enclosed therebetween, having a relative dielectric constant $\in_r$, the electrical properties thereof may be theoretically derived (cf. the article of L. Stark, "Lower modes of a concentric line having a helical inner conductor", Journ. Appl. Phys. 25, p. 1155, 1954).

By utilizing the considerations of the article mentioned before, a so-called compression factor $K_H$ may be derived corresponding to the ratio of the characteristic impedances of a line having a helical conductor and of a conventional line with a straight inner conductor. For compression factor $K_H$, the following equation applies:

$$k_H = \frac{z_H}{z_L} = \sqrt{1 + \frac{1-\left(\frac{b}{d}\right)}{2\ln\left(\frac{d}{b}\right)}(n\pi b)}$$

where $Z_H$ is the characteristic impedance of the line having a helical inner conductor, $Z_L$ is the characteristic impedance of the line having a straight inner conductor, b and d are the above-mentioned geometrical values, namely the diameter of helical inner conductor 42 and of outer conductor 40, respectively, and n, finally, is the winding density, i.e. the number of windings per meter length of line resonator 38.

If now the phase velocity on the line is computed, further calculation steps result in the effective wavelength $\lambda_H$ on the line with helical inner conductor:

$$\lambda_H = \frac{c}{f\sqrt{\varepsilon_r}} \frac{1}{\sqrt{1 + \frac{1-\left(\frac{b}{d}\right)^2}{2\ln\left(\frac{d}{b}\right)}(n\pi b)^2}} = \frac{\lambda_L}{k_H}$$

where c is the phase velocity, f the frequency and $\lambda_L$ the wavelength of a coaxial line having a straight inner conductor.

Considering now again the embodiment of FIG. 3, diameter b of inner conductor 42 may be assumed to be, for example, 5 mm and the diameter d of outer conductor 40 is assumed to be 10 mm. The dielectric constant $\varepsilon_r$ for air is 1. The winding density n shall be in the range of between 100 and 600 $m^{-1}$.

In that situation, the above given formulas show that the compression factor $K_H$ is in the range of between 1.6 and 7. Within this range, one obtains winding distances a in the range of between 10 mm and 1.8 mm, whereas the characteristic impedance of the line is in the range of between 60Ω and 290Ω.

The probeheads for nuclear resonance measurements as described in the context of the present application, hence, have a line resonator with an outer conductor and an inner conductor, the latter having a periodic structure as becomes apparent from the two examples of FIGS. 3 and 4. Such probeheads may be used for measurements at one single frequency as well as for measurements at several frequencies, Such a line resonator may, for example, be utilized in a probehead of a type described at the outset, such as disclosed in U.S. Pat. No. 5,861,748. The probeheads described therein having several lines, each of which with a straight inner conductor and a cylindrical outer conductor may be equipped with line resonators of the type described before. As the wavelengths of the standing waves on such line network is compressed as described above, it is possible to design a shortened length of the respective line and, hence, a shorter design of the entire probehead without modifying the resonance frequency of the probehead.

What is claimed is:

1. A probehead for nuclear magnetic resonance measurements having a network, said network comprising in series an NMR coil for receiving a sample, a line resonator configured as a delay line and a probehead terminal.

2. The probehead of claim 1, wherein said delay line has a closed outer conductor and an inner conductor.

3. The probehead of claim 2, wherein said outer conductor is essentially cylindrical.

4. The probehead of claim 2, wherein said inner conductor is configured helically.

5. The probehead of claim 4, wherein said inner conductor surrounds a body.

6. The probehead of claim 5, wherein said body is a dielectric.

7. The probehead of claim 5, wherein said body is electrically conductive and said inner conductor is covered by an isolating coating.

8. The probehead of claim 5, wherein said body is as long as said inner conductor.

9. The probehead of claim 5, wherein said body is shorter than said inner conductor.

10. The probehead of claim 5 wherein said body is tightly surrounded by said inner conductor.

11. The probehead of claim 5, wherein said body is surrounded by said inner conductor at a distance.

12. The probehead of claim 4, wherein said inner conductor has between 100 and 600 windings per meter length of said delay line.

13. The probehead of claim 2, wherein said inner conductor is configured essentially cylindrical and is slotted radially.

14. The probehead of claim 13, wherein said inner conductor has between 100 and 600 slots per meter length of said delay line.

15. The probehead of claim 1, wherein at a predetermined measuring frequency said delay line has an effective wavelength being shorter than a free wavelength of said measuring frequency by a factor of between 1.6 and 7.

16. The probehead of claim 3, wherein said delay line has a length and a diameter, said length being at least one order of magnitude longer than said diameter.

17. The probehead of claim 2, wherein a gap is provided between said inner conductor and said outer conductor, said gap being filled with a dielectric.

18. The probehead of claim 17, wherein said body and said dielectric within said gap have different dielectric constants.

19. The probehead of claim 2, wherein said inner conductor is provided with at least one intermediate tap.

20. In a probehead for nuclear magnetic resonance measurements having a network comprising an NMR coil for receiving a sample, a line resonator and a probehead terminal, a line resonator configured as a delay line having a closed outer conductor and an inner conductor, wherein said outer conductor is essentially cylindrical, said inner conductor is configured helically and said inner conductor surrounds a body.

21. In a probehead for nuclear magnetic resonance measurements having a network comprising an NMR coil for receiving a sample, a line resonator and a probehead terminal, a line resonator configured as a delay line having a closed outer conductor and an inner conductor, said inner conductor being configured essentially cylindrical and being slotted radially.

* * * * *